United States Patent [19]

Solomon et al.

[11] 4,160,244
[45] Jul. 3, 1979

[54] CONVERSION CIRCUIT

[75] Inventors: James E. Solomon, Saratoga; James B. Cecil, Santa Clara, both of Calif.

[73] Assignee: National Semiconductor Corporation, Santa Clara, Calif.

[21] Appl. No.: 661,124

[22] Filed: Feb. 25, 1976

[51] Int. Cl.² ............................................. H03K 13/03
[52] U.S. Cl. ........................ 340/347 DA; 340/347 AD
[58] Field of Search .............. 340/347 AD, 347 DA; 375/38 R; 307/238; 365/46

[56] References Cited

U.S. PATENT DOCUMENTS

| | | | |
|---|---|---|---|
| 3,039,030 | 6/1962 | Weidner | 340/347 DA |
| 3,573,795 | 4/1971 | Bowers | 340/347 DA |
| 3,614,327 | 10/1971 | Low | 340/347 DA X |
| 3,662,347 | 5/1972 | Fox | 340/347 AD UX |
| 3,705,359 | 12/1972 | Kappes | 340/347 AD |
| 3,812,478 | 5/1974 | Tomisawa | 307/238 |
| 3,890,602 | 6/1975 | Tomisawa | 365/46 |
| 3,895,378 | 7/1975 | Marcel | 340/347 DA |
| 3,997,892 | 12/1976 | Susset | 340/347 DA |

OTHER PUBLICATIONS

Paker "IEEE Transactions on Computers" vol. C-20, No. 1, Jan. 1971, pp. 7-11.

*Primary Examiner*—Charles D. Miller
*Attorney, Agent, or Firm*—Gail W. Woodward

[57] ABSTRACT

A digital-to-analog converter having a nonlinear transfer characteristic includes a voltage divider connected in parallel with a reference voltage and a switching array connected to the voltage divider. The switching array is actuated in accordance with the digital word which is being converted to an analog signal. The voltage divider is dimensioned to provide a nonlinear transfer characteristic. The digital-to-analog circuit is also employed for performing a successive approximation analog-to-digital conversion. The voltage divider is an integrated circuit resistor formed of an elongated strip of one polarity diffused in a semiconductor substrate of the opposite polarity, and some of the switches of the array are integrated circuit switches in which a portion of the continuous strip forms one terminal thereof.

2 Claims, 8 Drawing Figures

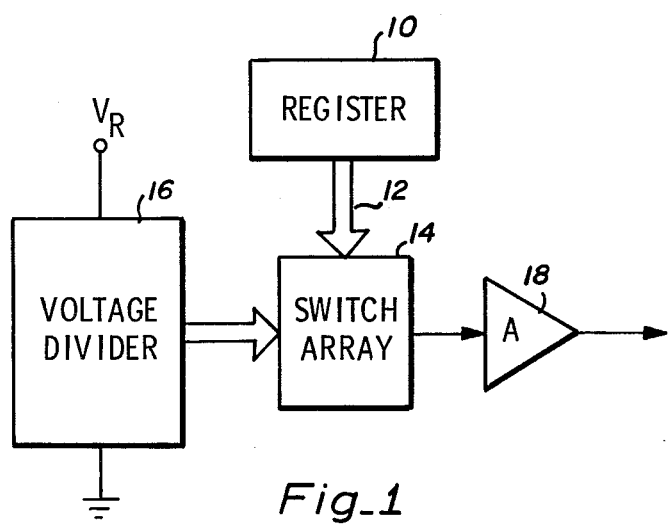
Fig_1
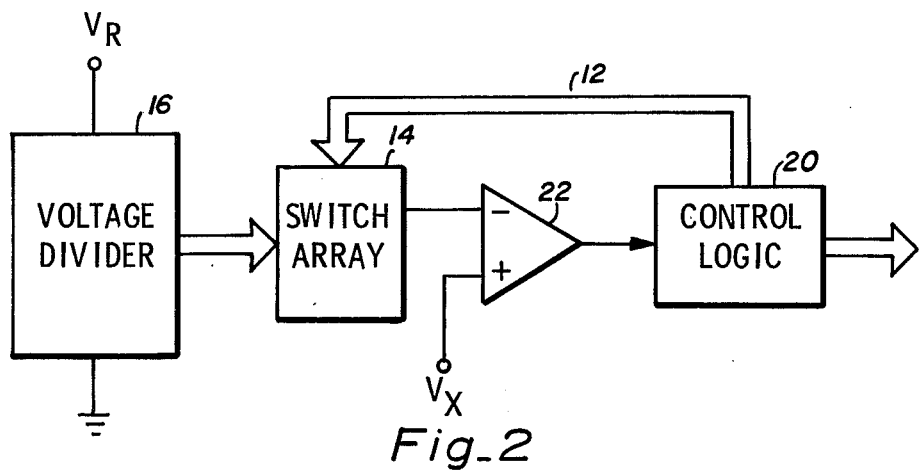
Fig_2
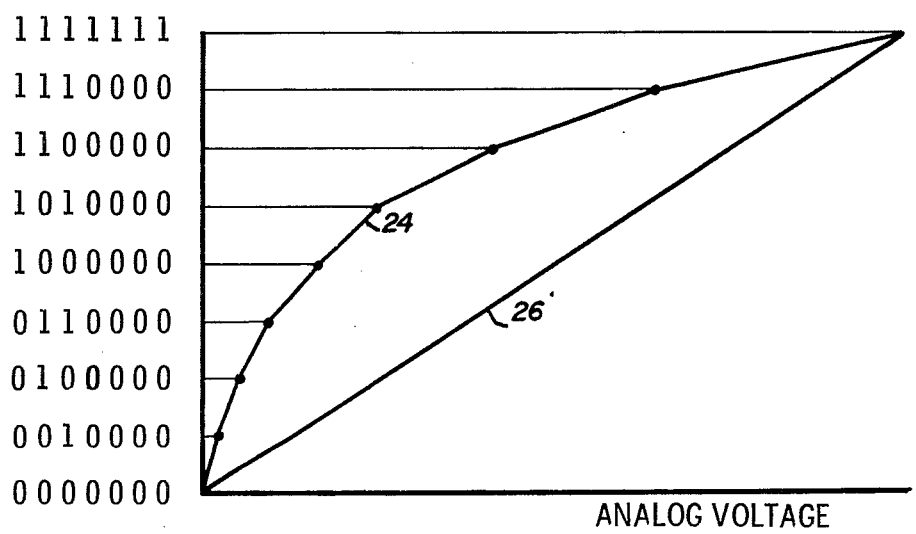
Fig_3

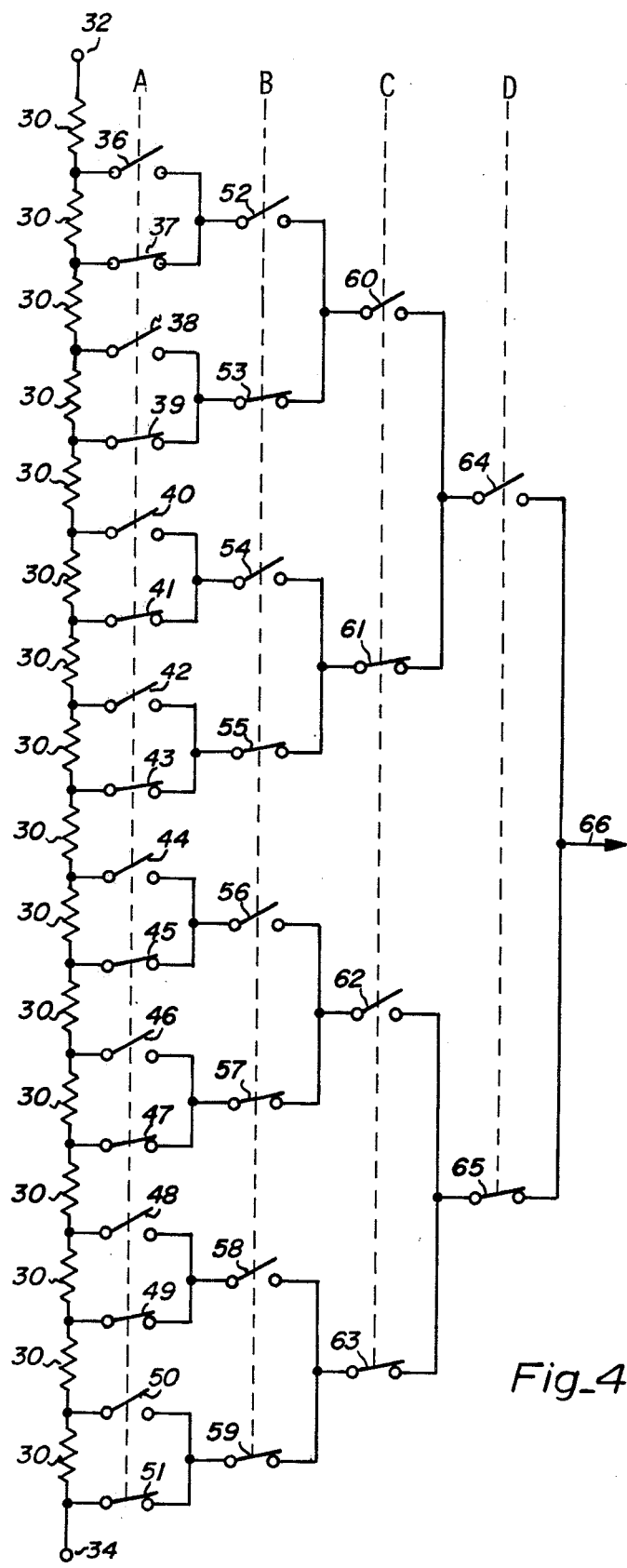
Fig_4

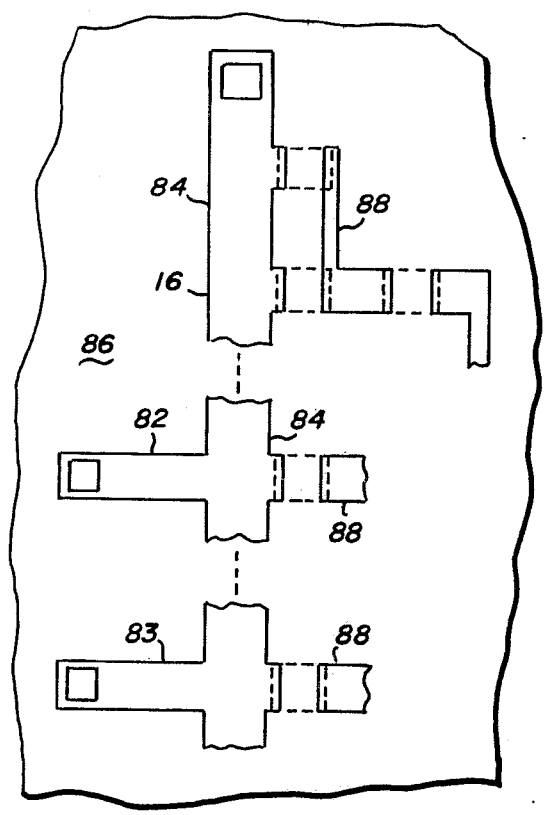
Fig_6
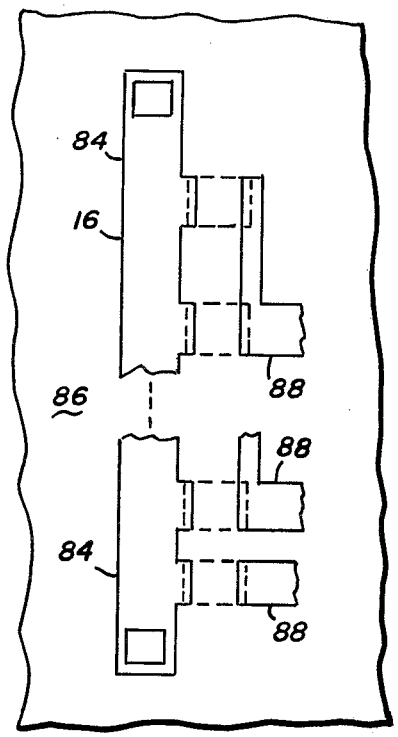
Fig_7
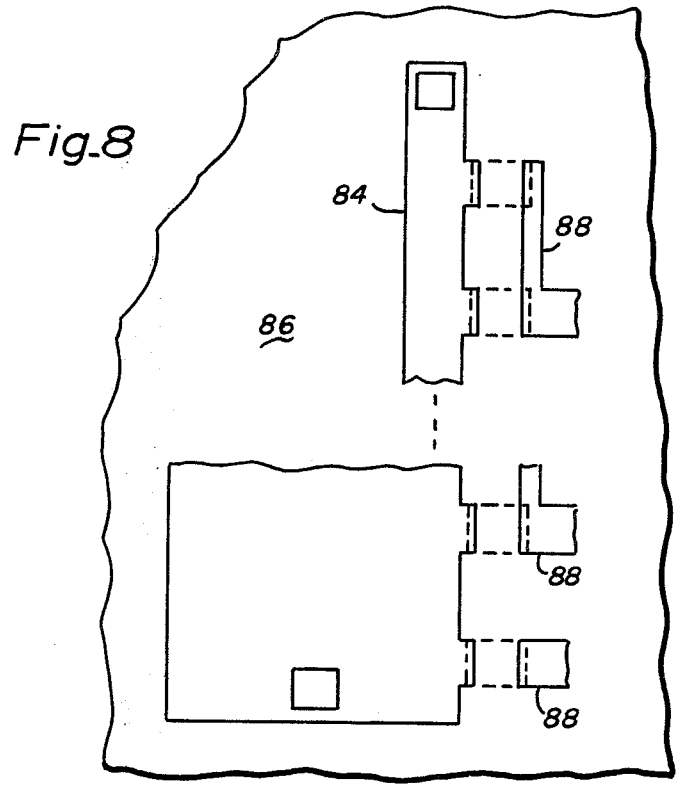
Fig_8

CONVERSION CIRCUIT

BACKGROUND OF THE INVENTION

1. Field of the Invention

This invention relates generally to a digital-to-analog convertor, and more particularly to an integrated circuit for performing a digital-to-analog conversion and a successive approximation analog-to-digital conversion in which the transfer characteristic is nonlinear.

2. Prior Art

Previous digital-to-analog (D/A) and analog-to-digital (A/D) converters having a nonlinear transfer characteristic require sophisticated and expensive circuitry to implement the desired transfer function. Because of the complexity of these converters, they cannot be contained in one integrated circuit package, but require several integrated circuit chips to accommodate all of the required circuitry to implement the desired transfer function. Furthermore, the majority of the known D/A converters and successive approximation A/D converters have monotinicit problems.

A nonmonotonic D/A converter is one in which the analog signal output thereof does not increment in the same direction with the successive application at an input thereof of binary words of increasing value. Of the known D/A converters, all require relatively closely matched components in order to be monotonic. More particularly, the components of the known D/A converters must be matched within one-half LSB in order for the converter to be monotonic. One LSB (least significant bit) is equal to the inverse of $2^n$, where n is equal to the number of bits in the binary word.

One well known and widely used D/A converter is commonly called an R-2R ladder D/A converter. This type of converter employs a resistor ladder network which contains twice as many resistors and as many switches as there are bits in the binary work which is being converted to an analog signal. This converter can also be used in a successive approximation A/D converter. The resistors of this network must be closely matched in order for the converter to be monotonic. More particularly, the resistor in the least significant bit branch of this network must be matched within one-half LSB of the termination resistor in order for the circuit to be monotonic. In a like manner, each branch of the network must be within one-half LSB of the total of the branches in parallel with and of lower order than that branch in order for the circuit to be monotonic. In an eight bit D/A converter, for example, the resistors must be matched within 0.2%.

Other D/A and successive approximation A/D techniques employ either capacitor networks or transformer networks. The components of these networks must also be closely matched in order for the converter to be monotonic. The majority of the known D/A converters which are monotonic require sophisticated and expensive processing techniques. Those D/A converters which are constructed of discrete components require the selection of relatively high accuracy components, such that the components are matched within one-half LSB. Therefore, these discrete circuits are also relatively expensive if they are monotonic.

The attractiveness of the R-2R D/A converter is that it can be designed such that actuation of any or all of the switches contained therein does not change the current through the branches of the resistor network. That is, as each switch is actuated, the current in each respective branch of the network will be supplied to a summing amplifier and will be equal to the current in that branch prior to the actuation of that switch. It can be appreciated that if a change in current resulted with the actuation of any one of the switches, an error would result which would be proportional to the current change. This error could be sufficient to cause the circuit to be nonmonotonic. Some of the other D/A converters do not have this inherent advantage and compensation must be made for the change in current which results with the actuation of the switches therein.

The problem of matching the value of components in a D/A converter circuit is further complicated by another factor. These circuits have been fabricated in the past by providing circuit connections between the components in the well known manner, with the type of connection depending upon the type of circuit, such as an integrated circuit or a discrete circuit. The contact points of these connections are ohmic contacts in that they may present some resistance to the circuit. The resistance of these ohmic contacts contributes to the mismatch between components and branches of the D/A converter. Since the amount of resistance presented by these contacts may vary considerably and cannot be predetermined, the mismatch which may result therefrom cannot be easily determined before the circuit is fabricated. Accordingly, the permissible mismatch between components and branches in these D/A converters must be less than one-half LSB to permit some tolerance for the resistance presented by ohmic contacts in the circuit. The resistance offered by these ohmic contacts may also contribute to the inaccuracy of those circuits in which a current change may occur as discussed above. The inaccuracy of such circuits may be the result of a nonlinear reponse of the circuit and/or an undesirable scaling of the gain of the circuit. Both of these factors can be present as a result of unpredictable ohmic contacts in the circuit. Accordingly, it can be appreciated that it is desirable to reduce the number of these ohmic contacts to a minimum.

In those integrated circuit D/A converters which depend upon current flow through various components and branches thereof, the geometry of the components must be comparable to the amount of current drawn thereby. Accordingly, these components may, in some cases, be quite large, thereby increasing the area of the integrated circuit chip which they are a part of. Also, the geometry of these components must be matched within the tolerances discussed above. It can be appreciated that it is desirable to maintain the area of an integrated circuit chip to a minimum and to obviate the necessity of matching the geometries of its components.

SUMMARY OF THE INVENTION

It is, therefore, an object of the present invention to provide a D/A converter and a successive approximation A/D converter having a nonlinear transfer characteristic.

Another object of the present invention is to provide such a converter which is inherently monotonic.

Still another object of the present invention is to provide an integrated circuit D/A converter and a successive approximation A/D converter which are extremely simple, and requiring relatively unsophisticated and inexpensive processing techniques.

A further object of the present invention is to provide a nonlinear D/A converter and successive approximation A/D converter which can be implemented on one integrated circuit chip.

These and other objects of the present invention are attained by a D/A converter circuit which includes a voltage divider connected in parallel with a reference voltage and a plurality of switching devices connected together in an array and responsive to individual bits of a binary word for generating an analog signal at an output of the array which is equivalent to the binary word. More particularly, if the binary word to be converted has n number of bits therein, then $N=2^n$. Under such conditions, the voltage divider has N outputs and the switching array includes N paths between respective outputs of the voltage divider and an output of the array, with n number of switches in each path. Each switch in each path corresponds to a respective bit of the binary word being converted and is responsive to the state of that bit. In the quiescent state of the switches, each path defines, by the state of each switch therein, a respective one of a plurality of binary words equivalent to numbers from 0 to N, respectively. Each $2^m$ adjacent outputs correspond to the mth bit of the binary words, and the voltage divider is dimensioned such that any one $2^m$ adjacent outputs have a different voltage drop thereacross than any other $2^m$ adjacent outputs.

The invention, however, as well as other objects, features and advantages thereof will be more fully realized and understood from the following detailed description, when taken in conjunction with the accompanying drawings, wherein:

BRIEF DESCRIPTION OF THE DRAWINGS

FIG. 1 is a block diagram of a D/A converter constructed in accordance with the principles of the present invention.

FIG. 2 is a block diagram of a successive approximation A/D converter constructed in accordance with the principles of the present invention.

FIG. 3 is a graphical representation of the transfer characteristic of the D/A converter and successive approximation A/D converter of the present invention.

FIG. 4 is a schematic and diagrammatic illustration of one portion of the voltage divider and switching array illustrated in FIGS. 1 and 2.

FIG. 6 is a plan view, partially broken away, of a portion of an integrated circuit monolethic chip configuration of the circuit illustrated in FIGS. 4 and 5.

FIG. 7 is a plan view, partially broken away, of a second embodiment of an integrated circuit monolethic chip which can be employed in place of the configuration illustrated in FIG. 6.

FIG. 8 is a plan view, partially broken away, of a third embodiment of an integrated circuit monolethic chip which can be employed in place of the configuration illustrated in FIG. 6.

Like reference numerals throughout the various views of the drawings are intended to designate the same elements.

DETAILED DESCRIPTION OF THE PREFERRED EMBODIMENTS

Figure 5:
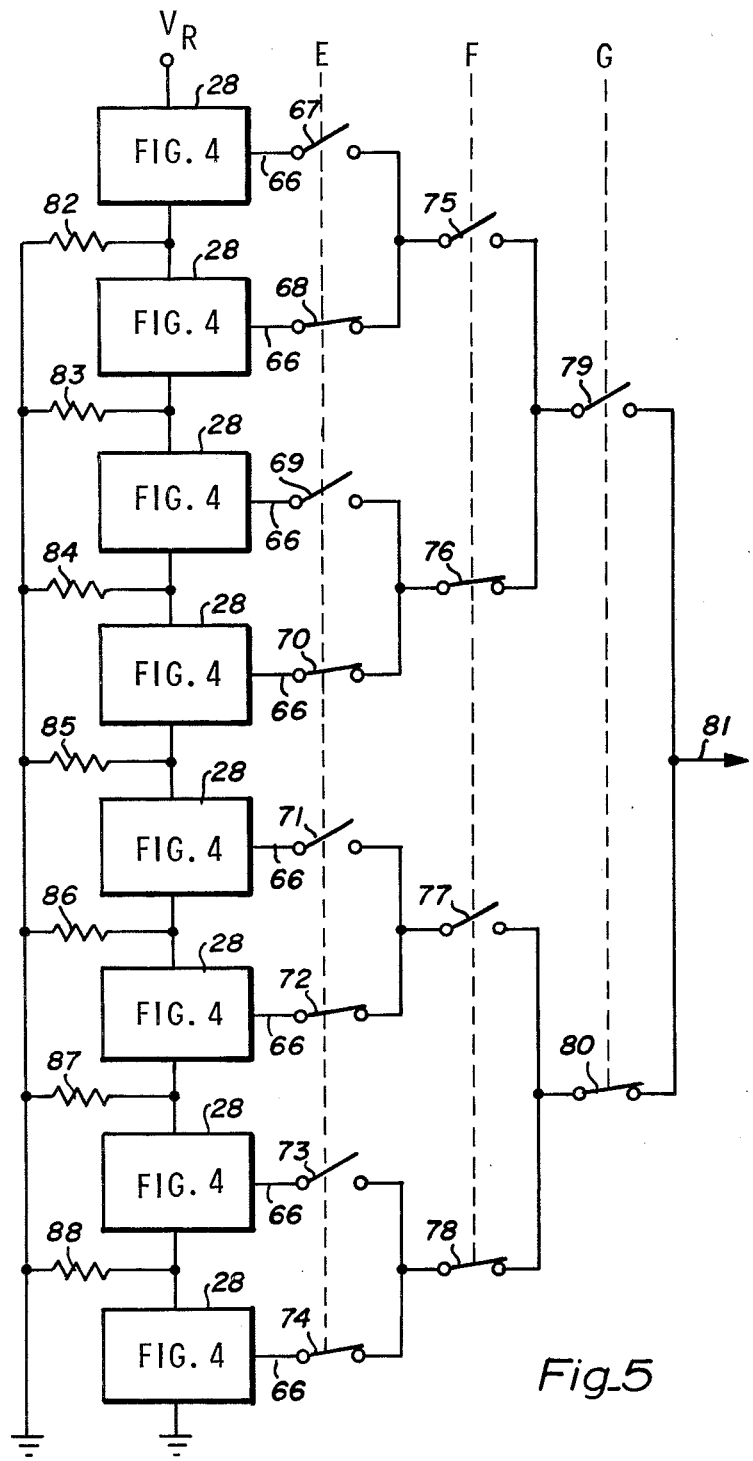
FIG. 5 is a schematic and diagrammatic illustration of the voltage divider and switching array illustrated in FIGS. 1 and 2.

FIG. 1 illustrates, in block diagram form, a system for converting a binary word to an analog signal. As shown therein, the binary word to be converted is contained in a register 10 and supplies each bit of the binary word on a plurality of lines 12 to a switching array 14. A voltage divider circuit 16 is connected in parallel with a reference voltage and has a plurality of outputs, each corresponding to all of the decimal numbers represented by all of the binary words which can be contained in the register 10. The switching array 14, in response to the state of the bits of the binary word contained in the register 10 connects a respective one of the voltage divider outputs to the input of a high impedance input buffer 18. Accordingly, the buffer 18 provides at an output thereof an analog signal which is equivalent to the binary word which is contained in the register 10 and is being converted.

FIG. 2 illustrates, in block diagram form, a system for converting an unknown analog signal to a binary word. The output of the voltage divider 16 is connected to the switching array 14 in the same manner as in the D/A converter illustrated in FIG. 1. Digital words are supplied successively to the switching array 14 on the lines 12 from control logic 20. The digital words to be supplied to the switching array 14 in succession are selected by the control logic 20 in response to an output supplied from a comparator circuit 22. An output of the switching array 14 is connected to one output of the comparator circuit 22 and the analog signal $V_x$ to be converted to a binary word is connected to the other input thereof. The output of the logic circuit 20 provides a binary word which corresponds to the amplitude of $V_x$.

For a complete understanding of the systems illustrated in FIGS. 1 and 2, reference is made to Application for U.S. Patent, Ser. No. 777,235, filed Mar. 11, 1977, by Adib R. Hamade and Sam S. Ochi, and which is a continuation of application Ser. No. 608,873 filed Aug. 29, 1975, now abandoned.

The converter circuits disclosed in the above mentioned application for patent have a linear transfer characteristic. The present invention, however, is concerned with D/A converters and successive approximation A/D converters having nonlinear transfer characteristics. In communications, there is a need for Codec (coder/decoder) circuits which convert analog information to digital form for transmission and then reconstruct the analog signal at a receiver end. In order to maintain the signal to noise ratio relatively high, it is desirable to have relatively fine resolution about ground and low level signals, and relatively coarse resolution at and near full scale and high level signals. Accordingly, and in accordance with the present invention, the converter systems illustrated in FIGS. 1 and 2 will have transfer characteristic as represented by the curve designated with the reference numeral 24 in FIG. 3. Although the present invention may have any desired nonlinear transfer characteristic, two standards have been established for which the present invention is particularly applicable. The A-Law standards have been established by the Consultive Committee on International Telephone and Telegraph, Geneva, Switzerland. The μ255 Law has been established by Bell Laboratories.

From FIG. 3, it will be noted that the curve 24 is composed of eight straight line segments and that the intersections of adjacent segments form break points which correspond to the three most significant bits of a binary word. The straight line curve 26 in FIG. 3 corresponds to a linear transfer characteristic.

The circuit illustrated in FIG. 5 provides such a nonlinear transfer characteristic. FIG. 5 is a schematic and diagrammatic illustration of the voltage divider 16 and switching array 14 illustrated in FIGS. 1 and 2. Each of those portions of the circuit illustrated in FIG. 5 which are designated with the reference numeral 28 are illustrated in greater detail in FIG. 4.

With reference to FIG. 4, a voltage divider is formed of a plurality of resistors 30 connected in series with one another between a terminal 32 and a terminal 34. Each of the outputs of the voltage divider is connected to a respective one of the switches 36-51. Adjacent ones of the switches 36-51 are connected together and through a respective one of switches 52-59, switches 60-63 and switches 64 and 65 to an output 66.

In FIG. 5 each of the lines 66 from the circuits 28 are connected through a respective one of switches 67-74, switches 75-78 and switches 79 80 to an output 81'. The switches 36-65 and 67-80 form the switching array 14. The circuits 28 in FIG. 5 are connected in series with a terminal 34 of one being connected to terminal 32 of another to form the voltage divider 16. The juncture between adjacent ones of the circuits 28 are connected through a respective one of resistors 82-88 to ground potential.

The switches 36-51 in FIG. 4 are controlled by the state of the least significant bit of the binary word being converted, which bit is represented by the letter A. The switches 52-59 are controlled by the second least significant bit of that binary word, which bit is represented by the letter B. Similarly, the switches 60-63 are controlled by the third least significant bit and the switches 64 and 65 are controlled by the forth least significant bit. The switches 67-74 are controlled by the state of the third most significant bit, the switches 75-78 are controlled by the state of the second most significant bit, and the switches 79 and 70 are controlled by the state of the most significant bit, as shown in FIG. 5. Table I shows the relative resistance values of resistors 82-88 with respect to the resistance between the terminals 32 and 34, if such resistance between those terminals is equal to R, for both A-Law and $\mu$255 Law.

TABLE I

|  | A-Law | $\mu$ 255 Law |
|---|---|---|
| R-88 | $\infty$ | R |
| R-87 | 2R | 1.5R |
| R-86 | 2R | 1.75R |
| R-85 | 2R | 1.87R |
| R-84 | 2R | 1.9375R |
| R-83 | 2R | 1.96875R |
| R-82 | 2R | 1.984375R |

It can be appreciated from FIGS. 4 and 5 that if the binary word to be converted has n number of bits therein, the voltage divider 16 will have N number of outputs, where $N=2^n$. Also, the switching array 14 will have one path from each output of the voltage divider 16 to its output, with n number of switches in each path. Each output of the voltage divider has an analog voltage thereon which corresponds to a respective, but different one of all of the binary words corresponding to the decimal numbers from 0 to N-1. Also, each $2^m$ adjacent outputs correspond to the $m^{th}$ bit of those binary words, and the voltage divider 16 is dimensioned such that any m adjacent outputs have a different voltage drop thereacross then any other m adjacent outputs.

As shown in FIGS. 6, 7 and 8, the switching array 14 and voltage divider 16 of FIGS. 1 and 2 are preferably constructed of a metal oxide semiconductor (MOS) integrated circuit monlithic chip. The voltage divider 16 is formed of a layer 84 of material of one polarity diffused in a layer of semiconductor material 86 of the opposite polarity, such as a substrate. In P-MOS circuitry, the layer 84 is of P material and the layer 86 is of N material. In addition, a plurality of layers 88 of the same material as the layer 84 are also diffused in the layer 86. Portions of the layer 84 from the source of MOS FET switches 36-51 of each of the circuits 28, with the drain thereof being formed by a respective one of the layers 88. The upper surface of the semiconductor layer 86 with the layers of materials 84 and 86 diffused therein is covered with an oxide layer (not shown). The thickness of the oxide layer is reduced at those portions indicated with the dotted lines and joining the layers 84 and 88, and these relatively thin portions form a gate oxide layer which bridges the gap between respective portions of the layer 84 and the layers 88. A metallic layer (not shown) which coincides with the dotted portions in the drawing overlies each of the gate oxide layers. Each of the metallic layers forms the gate of each of the MOS FET switches 36-51 of each of the circuits 28.

The embodiment illustrated in FIG. 6 corresponds to that illustrated in FIG. 5, wherein extensions of the layer 84 form the resistors 82-88 in FIG. 5. FIG. 7 illustrates a second embodiment of the present invention in which the resistance of one portion of the voltage divider 16 is different from other portions thereof, such that a nonlinear transfer characteristic is achieved. This is accomplished by maintaining the width of the layer 84 constant across the entire length thereof, but varying the length thereof from one of the circuits 28 to the others of the circuits 28. A similar effect is realized by the embodiment illustrated in FIG. 8 by varying the width of the layer 84 in each of the circuits 28 while maintaining the distance between respective outputs thereof constant.

The invention claimed is:

1. A circuit for converting a digital word having n bits into an analog voltage having N different values, each value representing a different combination of bits in said word whereby said word can represent the numbers from 0 to N−1 and $N=2^n$, said circuit having first and second terminals and comprising:

means for coupling a reference voltage between said first and second terminals in said circuit to provide a reference current therein;

means for coupling a plurality of M resistor voltage dividers in series between said first and second terminals to divide said reference voltage into M increments associated with the $m^{th}$ bit within said digital word and $M=2^m$;

each of said voltage dividers comprising a plurality of series connected resistors which further divide each of said M increments into smaller increments wherein said plurality of voltage dividers in combination produce N increments of said reference voltage;

a plurality of switching devices forming an array coupled between said voltage dividers and an output terminal to provide N different paths to said output terminal whereby any one of said N increments of said reference voltage can be applied to said output terminal as a function of the bit content of said digital word, said array of switching devices being arranged in a first group coupled to said voltage dividers and actuatable by the least significant bits in said digital word up to said $m^{th}$ bit, and a second group coupled between said first group and said output terminal and actuatable by the most significant bits of said word including said $m^{th}$ bit; and shunt resistor means coupled between the junctures of said voltage dividers and one of said first and second terminals to create an R-2R ladder network for making said M increments to have different voltage values whereby said analog voltage has an A-Law relationship to said numbers represented by said digital word.

2. A circuit for converting a digital word having n bits into an analog voltage having N different values, each value representing a different combination of bits in said word whereby said word can represent the numbers from 0 to $N-1$ and $N=2^n$, said circuit having first and second terminals and comprising:

means for coupling a reference voltage between said first and second terminals in said circuit to provide a reference current therein;

means for coupling a plurality of M resistor voltage dividers in series between said first and second terminals to divide said reference voltage into M increments associated with the $m^{th}$ bit within said digital word and $M=2^m$;

each of said voltage dividers comprising a plurality of series connected resistors which further divide each of said M increments into smaller increments wherein said plurality of voltage dividers in combination produce N increments of said reference voltage;

a plurality of switching devices forming an array coupled between said voltage dividers and an output terminal to provide N different paths to said output terminal whereby any one of said N increments of said reference voltage can be applied to said output terminal as a function of the bit content of said digital word, said array of switching devices being arranged in a first group coupled to said voltage dividers and actuatable by the least significant bits in said digital word up to said $m^{th}$ bit, and a second group coupled between said first group and said output terminal and actuatable by the most significant bits of said word including said $m^{th}$ bit; and shunt resistor means coupled between the junctures of said voltage dividers and one of said first and second terminals, said shunt resistor means being selected to produce a modified R-2R ladder network for making said M increments to have different voltage values whereby said analog voltage has a $\mu 225$ Law relationship to said numbers represented by said digital word.

* * * * *